(12) United States Patent
Barrena et al.

(10) Patent No.: US 9,194,573 B2
(45) Date of Patent: Nov. 24, 2015

(54) HEAT-SINK/CONNECTOR SYSTEM FOR LIGHT EMITTING DIODE

(75) Inventors: Juan J. Barrena, Johnston, RI (US); Edward J. Claprood, West Boylston, MA (US); Eric K. Larson, Cumberland, RI (US)

(73) Assignee: Illinois Tool Works Inc., Glenview, IL (US)

( * ) Notice: Subject to any disclaimer, the term of this patent is extended or adjusted under 35 U.S.C. 154(b) by 161 days.

(21) Appl. No.: 13/994,019

(22) PCT Filed: Dec. 14, 2011

(86) PCT No.: PCT/US2011/064952
§ 371 (c)(1),
(2), (4) Date: Jun. 13, 2013

(87) PCT Pub. No.: WO2012/082925
PCT Pub. Date: Jun. 21, 2012

(65) Prior Publication Data
US 2013/0265782 A1 Oct. 10, 2013

Related U.S. Application Data

(60) Provisional application No. 61/423,153, filed on Dec. 15, 2010, provisional application No. 61/521,178, filed on Aug. 8, 2011.

(51) Int. Cl.
*F21V 29/00* (2015.01)
*F21K 99/00* (2010.01)
*F21V 17/00* (2006.01)
(Continued)

(52) U.S. Cl.
CPC . *F21V 29/22* (2013.01); *F21K 9/00* (2013.01); *F21V 17/00* (2013.01); *F21V 17/16* (2013.01); *F21V 17/164* (2013.01); *F21V 29/70* (2015.01); *F21Y 2101/02* (2013.01); *Y10T 29/49128* (2015.01)

(58) Field of Classification Search
CPC ..... F21V 29/004; F21V 21/08; F21V 21/088; F21Y 2103/00; F21Y 2101/02; F21K 9/00; F21S 4/001
USPC .......................... 362/373, 396, 218, 294, 800
See application file for complete search history.

(56) References Cited

U.S. PATENT DOCUMENTS 4,571,823 A * 2/1986 Anderson ........................ 29/749
5,200,657 A * 4/1993 Prestel ............................ 310/50
(Continued)

FOREIGN PATENT DOCUMENTS

DE 102007038787 A1 2/2009
WO 2011037351 A2 3/2011

OTHER PUBLICATIONS

International Search Report and Written Opinion corresponding to PCT/US2011/064952, dated Apr. 25, 2012.

*Primary Examiner* — Jong-Suk (James) Lee
*Assistant Examiner* — Mark Tsidulko

(57) ABSTRACT

An assembly for high-powered LEDs provides a direct attachment of the LED to a ceramic thermal conductor/electrical insulator sealed in a housing with a compression element between a portion of the housing and ceramic heat sink to provide a predetermined range of biasing force locating the ceramic heat sink against the portion of the housing with dimensional changes in the ceramic heat sink caused by thermal expansion of the ceramic heat sink.

14 Claims, 9 Drawing Sheets

(51) Int. Cl.
*F21V 17/16* (2006.01)
*F21V 29/70* (2015.01)
*F21Y 101/02* (2006.01)

(56) References Cited

U.S. PATENT DOCUMENTS

| | | | |
|---|---|---|---|
| 5,714,802 A * | 2/1998 | Cloud et al. | 257/726 |
| 5,755,752 A * | 5/1998 | Segal | 607/89 |
| 6,404,636 B1 * | 6/2002 | Staggers et al. | 361/704 |
| 6,871,983 B2 * | 3/2005 | Jacob et al. | 362/364 |
| 8,192,064 B2 * | 6/2012 | Johnson et al. | 362/545 |
| 8,256,928 B2 * | 9/2012 | Kondo | 362/294 |
| 8,378,455 B2 * | 2/2013 | Feichtinger et al. | 257/537 |
| 8,390,193 B2 * | 3/2013 | Li et al. | 313/512 |
| 8,674,932 B2 * | 3/2014 | Armstrong | 345/156 |
| 2002/0113244 A1 | 8/2002 | Barnett et al. | |
| 2012/0026729 A1* | 2/2012 | Sanchez et al. | 362/218 |

* cited by examiner

HEAT-SINK/CONNECTOR SYSTEM FOR LIGHT EMITTING DIODE

CROSS REFERENCE TO RELATED APPLICATION

This application is a National Phase of International Application Number PCT/US2011/064952, filed Dec. 14, 2011, and claims the benefit of U.S. Provisional Application 61/423,153 filed Dec. 15, 2010, and the benefit of U.S. Provisional Application 61/521,178 filed Aug. 8, 2011.

FIELD OF THE INVENTION

The present invention relates to light emitting diodes and in particular to an improved heat sink assembly for high-powered light emitting diodes.

BACKGROUND OF THE INVENTION

High-powered light emitting diodes are increasingly replacing other light technologies, including incandescent and fluorescent lamps, for general illumination purposes. Such high-powered light emitting diodes accept currents in excess of 100 milliamps and typically at least one ampere to provide a light output for illumination of a space or area, for example, in an appliance such as a refrigerator or the like.

High-powered light emitting diodes normally require a heat sink to prevent destructive overheating. For this purpose, the light emitting diode will be placed on a carrier such as a printed circuit board holding conductive traces to connect the light emitting diode to other circuitry or power leads. The substrate may be attached to a heat sink, for example, of molded or extruded aluminum to conduct heat generated by the light emitting diode away from the diode into ambient air or other medium.

SUMMARY OF THE INVENTION

The present invention provides a high-powered LED assembly in which the LED is attached directly to the heat sink without the need for an intervening printed circuit board. By eliminating the thermal resistance of the substrate, improved cooling of the LED may be provided permitting higher power or longer life illumination systems. Electrical connection between the LED and a wiring harness is provided by a spring clamp system that both retains and attaches to a wire conductor and provides a positive electrical connection to a trace on the surface of the heat sink that may in turn attach to the LED.

Specifically, the present invention provides an LED assembly having a LED dissipating during operation at least 500 mW attached in thermal communication with the first surface of the ceramic heat sink. The LED is attached to a first and second conductive lead. A sealed housing receives the ceramic heat sink and LED therein and has a first portion fitting over the LED to permit the passage of light therethrough and a second portion providing for sealed ingress of the first and second electrical conductors through a housing wall for providing power to the LED. A compression element extends between a portion of the housing and ceramic heat sink to provide a predetermined range of biasing force, locating the ceramic heat sink against the portion of the housing with dimensional changes in the ceramic heat sink caused by thermal expansion of the ceramic heat sink.

It is thus a feature of at least one embodiment of the invention to provide for a fluid tight housing protecting and LED attached to a ceramic substrate that may accommodate thermal expansion of the substrate.

The first portion of the sealed housing may be a light-transmissive thermoplastic and the second portion of the sealed housing is a thermoplastic fused to the first portion. Similarly, the electrical conductors may have integral coaxial thermoplastic insulation and where the second portion of the sealed housing may be fused to the thermoplastic insulation.

It is thus a feature of at least one embodiment of the present invention to provide a simple method for producing a sealed housing amenable to mass production through injection molding.

The spring clamp may be a flexible metal ring.

It is thus a feature of at least one embodiment of the present invention to provide a fatigue resistant spring element that may handle multiple cycles of thermal expansion.

The first portion of the sealed housing may provide a ledge abutting a portion of the first surface of the ceramic heat sink and a collar extending around a portion of the ceramic heat sink behind the first surface and the spring clamp may include cantilevered teeth portions providing a wedging engagement with an inner surface of the collar to hold the flexible metal ring in abutment with a second surface of ceramic heat sink behind the first surface.

It is thus a feature of at least one embodiment of the present invention to provide a method of staking the components together prior to sealing of the housing that may make use of the spring element.

The metal ring may further include protrusions contacting the second surface and limiting the force applied thereto.

It is thus a feature of at least one embodiment of the present invention to control the maximum force is applied to the ceramic to prevent damage thereto. The protrusions limit maximum force and by providing a space between the ring and the ceramic allow greater compliancy of the spring force.

The first surface may include metal traces attached directly to the first surface and electrically communicating between the LED and first and second conductors.

It is thus a feature of at least one embodiment of the present invention to allow close integration of the LED to the ceramic substrate.

The metal traces may be printed conductive ink.

It is thus a feature of at least one embodiment of the present invention to provide a simplified electrical connection to the LED die possible in the sealed environment of the housing.

The ceramic may be Steatite.

It is thus a feature of at least one embodiment of the present invention to provide a readily manufactured ceramic material that is thermally conductive and yet electrically insulated.

The LED assembly may further include a first and second spring clamp insertable through apertures in the ceramic heat sink each having first portions, contacting different conductive traces when so inserted, and clamping elements receiving and retaining different of the first and second conductors.

It is thus a feature of at least one embodiment of the present invention to provide a method allowing electrical communication between wires and conductive traces with simple mechanical assembly.

The first portion of the spring clamps may be spring biased by the spring clamp against the conductive trace.

It is thus a feature of at least one embodiment of the present invention to provide a positive connection between a conductive material on the ceramic and a conductor, with thermal expansion and contraction of the ceramic.

The clamping elements of the spring clamps may provide flexible opposed spring elements slidably receiving ends of the conductors in electrical engagement.

It is thus a feature of at least one embodiment of the present invention to provide a simple connector-like attachment of conductive wires to the LED Other features and advantages of the invention will become apparent to those skilled in the art upon review of the following detailed description, claims and drawings in which like numerals are used to designate like features.

Figure 1:
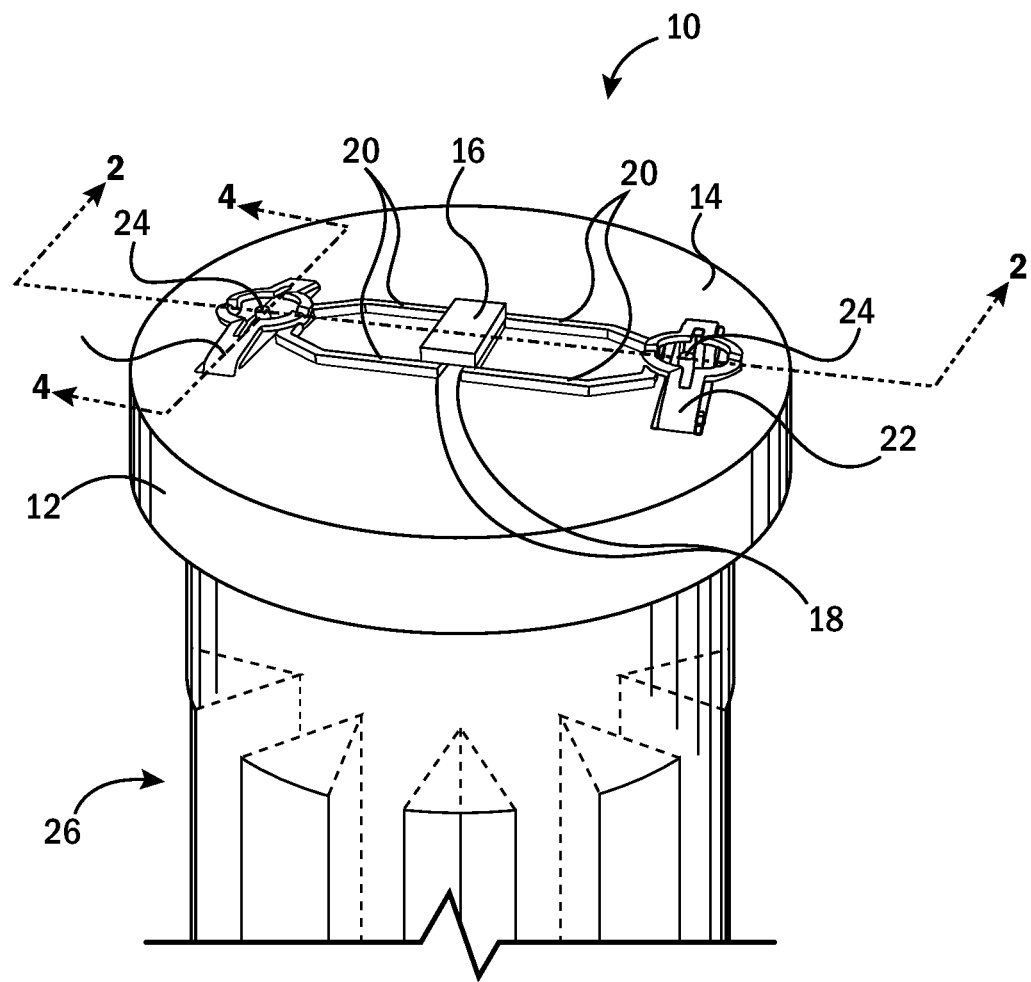
FIG. 1 is a fragmentary perspective view of a ceramic heat sink used in the present invention supporting an LED die for direct mounting thereon and showing conductive metal traces attached to the ceramic surface.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE PREFERRED EMBODIMENTS

Referring now to FIG. 1, an LED assembly 10 per one embodiment of the present invention may provide for a ceramic substrate/heat sink 12 having an upper planar surface 14 supporting a high-powered LED 16. The LED 16 may include conductive pads 18 attached to conductive traces 20 attached directly to the upper planar surface 14 of the ceramic substrate/heat sink 12 for example by printing. The conductive traces 20 may communicate from the conductive pads 18 to spring clamps 22 connected to power lead conductors 24 as will be described.

The ceramic substrate/heat sink 12 in one embodiment may be Steatite or soapstone that has been formed by a compression molding and fired to a high temperature to impart good thermal conductivity and high electrical resistance. Steatite is predominately a hydrated magnesium silicate. In one embodiment, the coefficient of thermal expansion of the ceramic substrate/heat sink 12 is approximately matched to that of the traces 20 and, for example, when the ceramic is Steatite, an L3 grade may be selected. The traces 20 are preferably formed of a silkscreened silver/platinum ink that is baked onto the surface of the ceramic substrate/heat sink 12 for improved adhesion.

The ceramic substrate/heat sink 12 extends away from the upper planar surface 14 to a fluted heat sink body portion 26 to provide thermal coupling to ambient air or the like through the increased surface area of fins according to well-known techniques.

Figure 2:
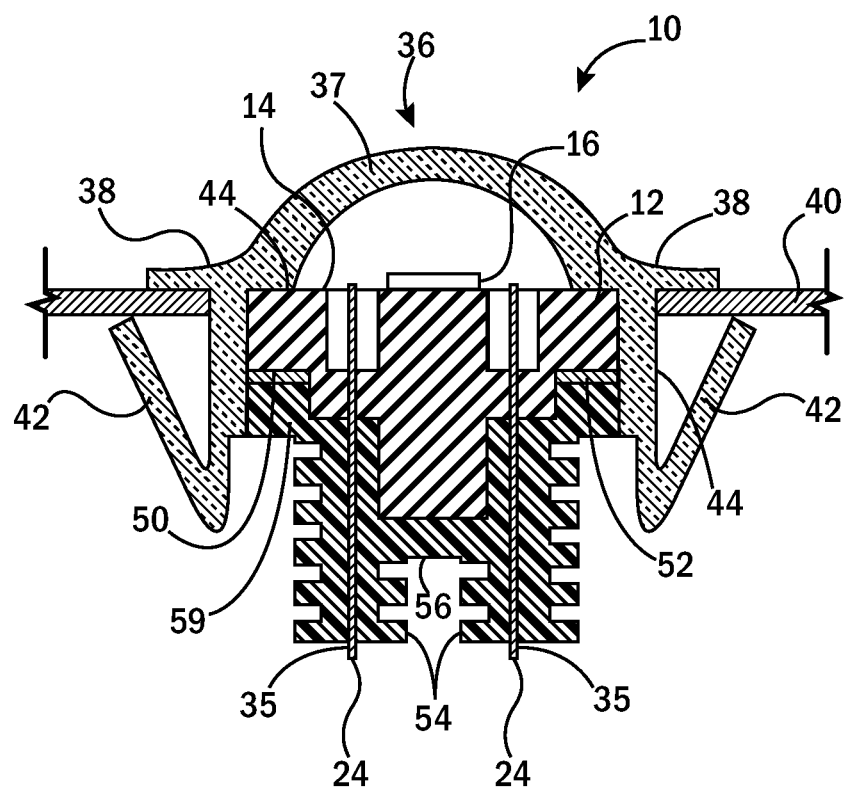
FIG. 2 is a cross-sectional view along the line 2-2 of FIG. 1 showing incorporation of the ceramic heat sink into a protective molded assembly.

Referring now to FIG. 2, the LED assembly 10 may further provide a supporting package including a lens assembly 36 providing a hemispherical dome 37 over the LED 16. The hemispherical dome 27 may be of transparent thermoplastic having dimensions that follow a portion of the sphere substantially centered on the LED 16 with a diameter slightly smaller than the upper planar surface 14. A radially extending flange 38 may pass outward from the periphery of the hemispherical dome 37 having a lower surface substantially equal to the height of the upper planar surface 14. This flange 38 may extend over a sheet-metal console 40 or the like having an opening size to accept the LED assembly 10 therein. Clips 42 may extend rearward from the bottoms of the flanges 38 to fit through the hole in the sheet-metal console 40. The clips 42 provide a spring-loaded outward cantilevered arm to retain the LED assembly 10 against the sheet-metal console 40, the latter sandwiched between a lower portion of the flange 38 and upper portion of each cantilevered arm of the clips 42.

A cylindrical collar or socket 44 may also extend rearward from the flange 38 inside of the clip 42 to receive the upper planar surface 14 of the ceramic substrate/heat sink 12 therethrough. The periphery of the upper planar surface 14 of the ceramic substrate/heat sink 12 within the cylindrical socket 44 may abut against a lip 46 of the dome 37. The ceramic substrate/heat sink 12 may present a flange surface 50 at the periphery of its rearward face that may receive a compression washer 52 fitting between the inner walls of the cylindrical socket 44 and the flange surface 50 to retain the ceramic substrate/heat sink 12 abutting the lip 46.

Figure 7:
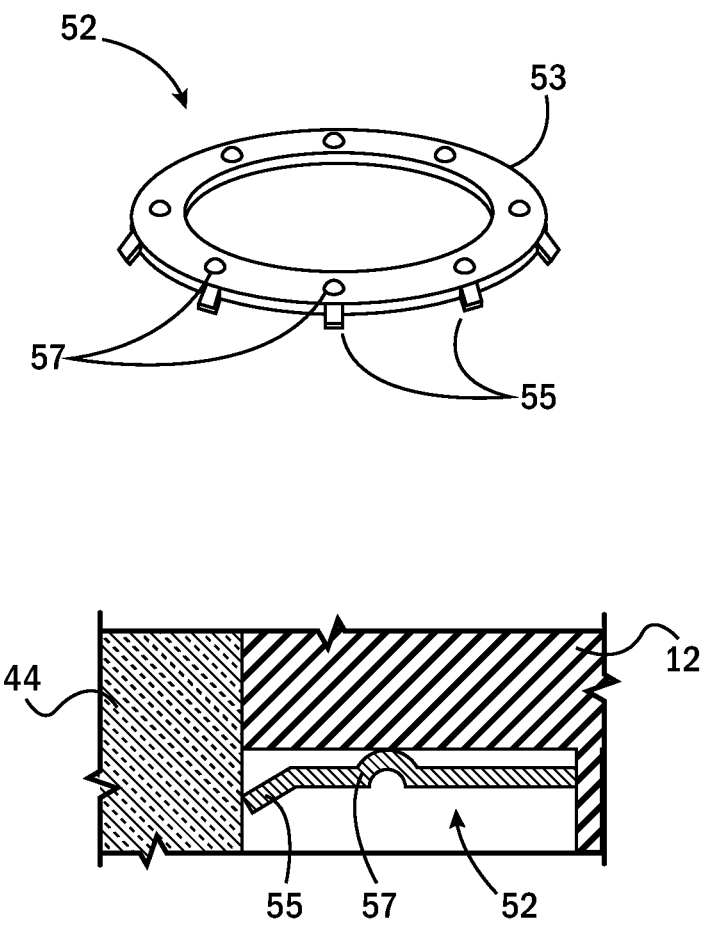
FIG. 7 is a perspective view and partial cross-sectional view of a compression element retaining the heat sink in the protective molded assembly while accommodating thermal expansion.

Referring also to FIG. 7, the compression washer 52 may be formed from a flexible metal sheet and may provide a ring 53 having outwardly splayed pawls 55 that operate to stake the compression washer 52 within the cylindrical socket 44 with a press-fitting operation so that the ring 53 closely abuts the flange surface 50 and the splayed pawls 55 are braced against the inner surface of the cylindrical socket 44 in the manner of a ratchet pawl to prevent shifting of the ring 53 away from the surface 50. The ring 53 may provide for embossed dimples 57 that serve to limit the force of the compression washer 52 against the surface 50 and by providing a space between the ring 53 and the surface 50, allow flexure of the compression washer 52 accommodate thermal expansion of the ceramic substrate/heat sink 12 within the sealed housing.

Referring again to FIG. 2, a remainder of the cylindrical socket 44 beyond the flange surface 50 and compression washer 52 may be filled with a low temperature thermoplastic 59 such as nylon to seal out moisture from the dome 37 by fusing with the inner wall of the cylindrical socket 44. The low temperature thermoplastic 59 may also be molded into strain relief arms 54 extending rearward along the conductors 24 to seal the conductors 24 by fusing with the insulation covering of the conductors 24. The strain relief arms 54 have circumferential ribs providing controlled flexibility and limiting a radius of curvature of the bending of the conductors 24.

A bridge of thermoplastic 56 between the strain relief arms 54 abuts a rear surface of the ceramic substrate/heat sink 12 to further prevent its disengagement.

Figure 3:
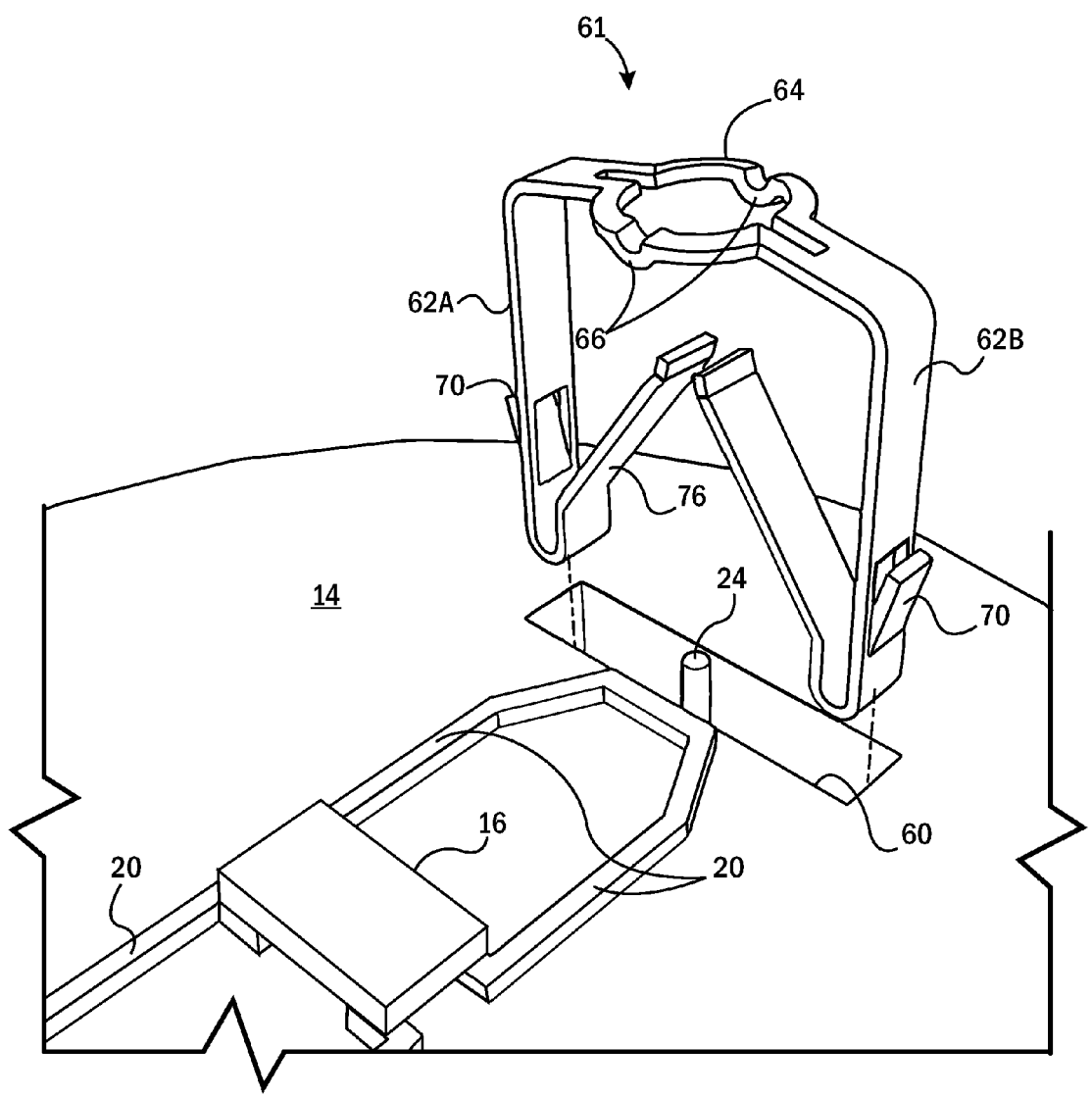
FIG. 3 is an exploded, perspective fragmentary view of the top of the heat sink showing a spring clamp insertable into a slot in the heat sink.
Figure 4:
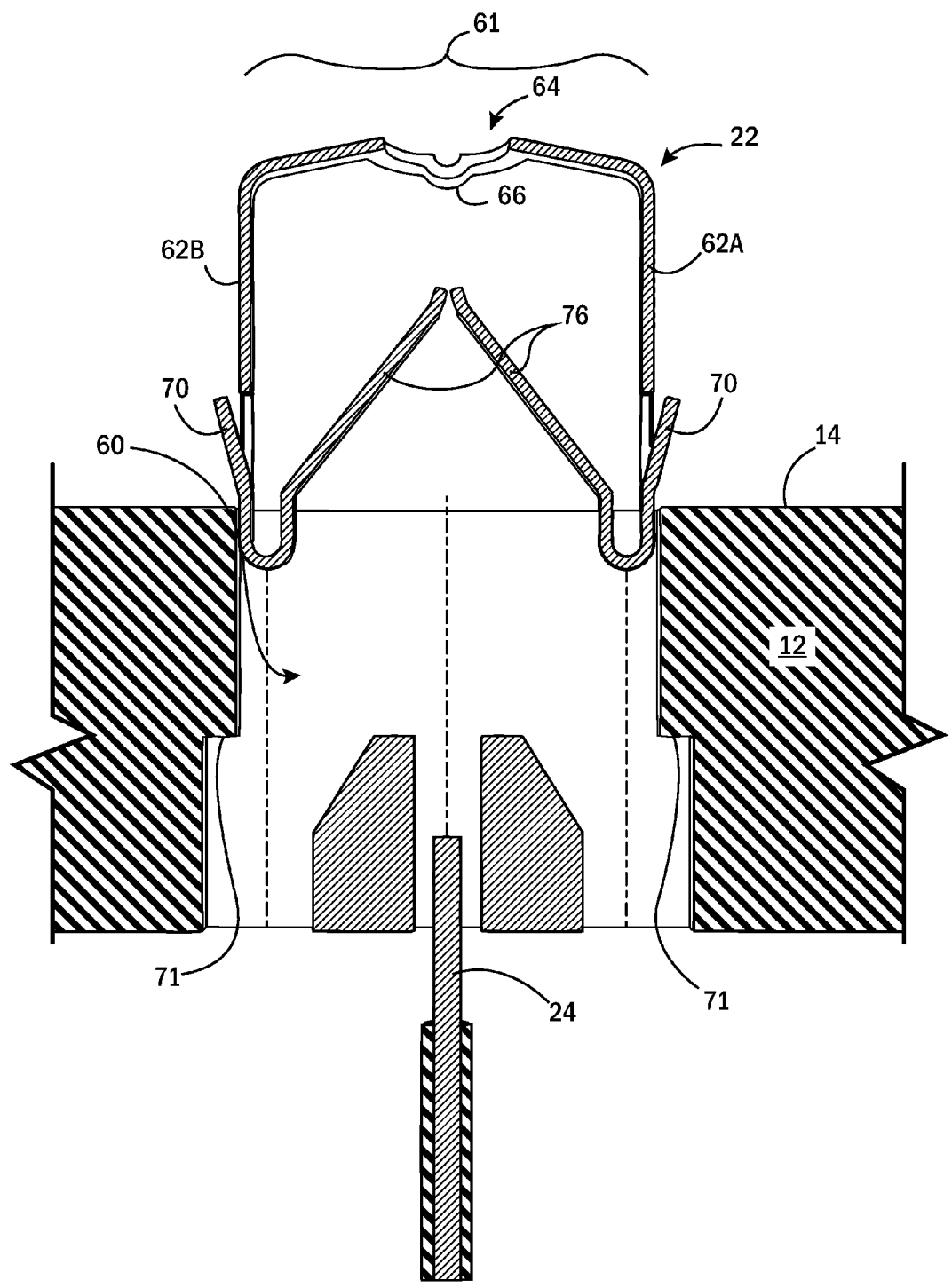
FIG. 4 is a cross-section along line 4-4 of FIG. 1 showing the spring clamp before insertion into the heat sink and the wire conductor before insertion into the spring clamp.

Referring now to FIGS. 3 and 4, the conductive traces 20 leading from the LED 16 may extend toward the periphery of the upper surface 14 toward two separated rectangular openings 60 extending downward into the surface 14 which may receive the power lead conductors 24 upward therethrough. A spring clamp 22 may be inserted into the rectangular openings 60 to provide electrical connection between the power lead conductor 24 and the conductive traces 20 for each lead of the LED 16.

The spring clamp 22 may be formed from a single strip of metal such as a brass or bronze and provides an upper bridge 61 that will ultimately lie generally parallel to the upper surface 14 of the ceramic substrate/heatsink 12 and which has left and right legs 62a and 62b extending downward there from to fit into rectangular openings 60. The width of the legs 62 (generally perpendicular to the long extent of the bridge 61) conforms to the width (shortest cross-sectional dimension) of the rectangular opening 60 and the separation of the legs 62a and 62b conform generally to the length (longest cross-sectional dimension) of the rectangular opening 60 so that the spring clamp 22 may fit snugly within the rectangular opening 60.

The center of the bridge 61 provides a ring portion 64 which will be coaxial around the upward extending conductor 24 when the spring clamp 22 is in place in the rectangular opening 60 with the bridge 61 substantially flush against the top of the surface 14 and the conductor 24 engaged with the spring clamp 22 after passing upward through the ceramic substrate/heatsink 12. The ring portion 64 includes left and right downwardly extending dimples 66 bisecting the ring portion 64 and the bridge 61. The dimples 66 are separated from each other by a distance greater than the width of the rectangular openings 60 so as to straddle the rectangular openings 60 when the spring clamp 22 is in place in the rectangular opening 60. One dimple 66 will contact the upper surface of the conductive trace 20 closest to the rectangular opening 60 and the other dimple 66 will contact the upper surface 14 directly on the opposite side of the rectangular opening 60 to stabilize the ring portion 64 against torsion (the thickness of the conductive traces 20 is greatly exaggerated in FIG. 3).

Figure 6:
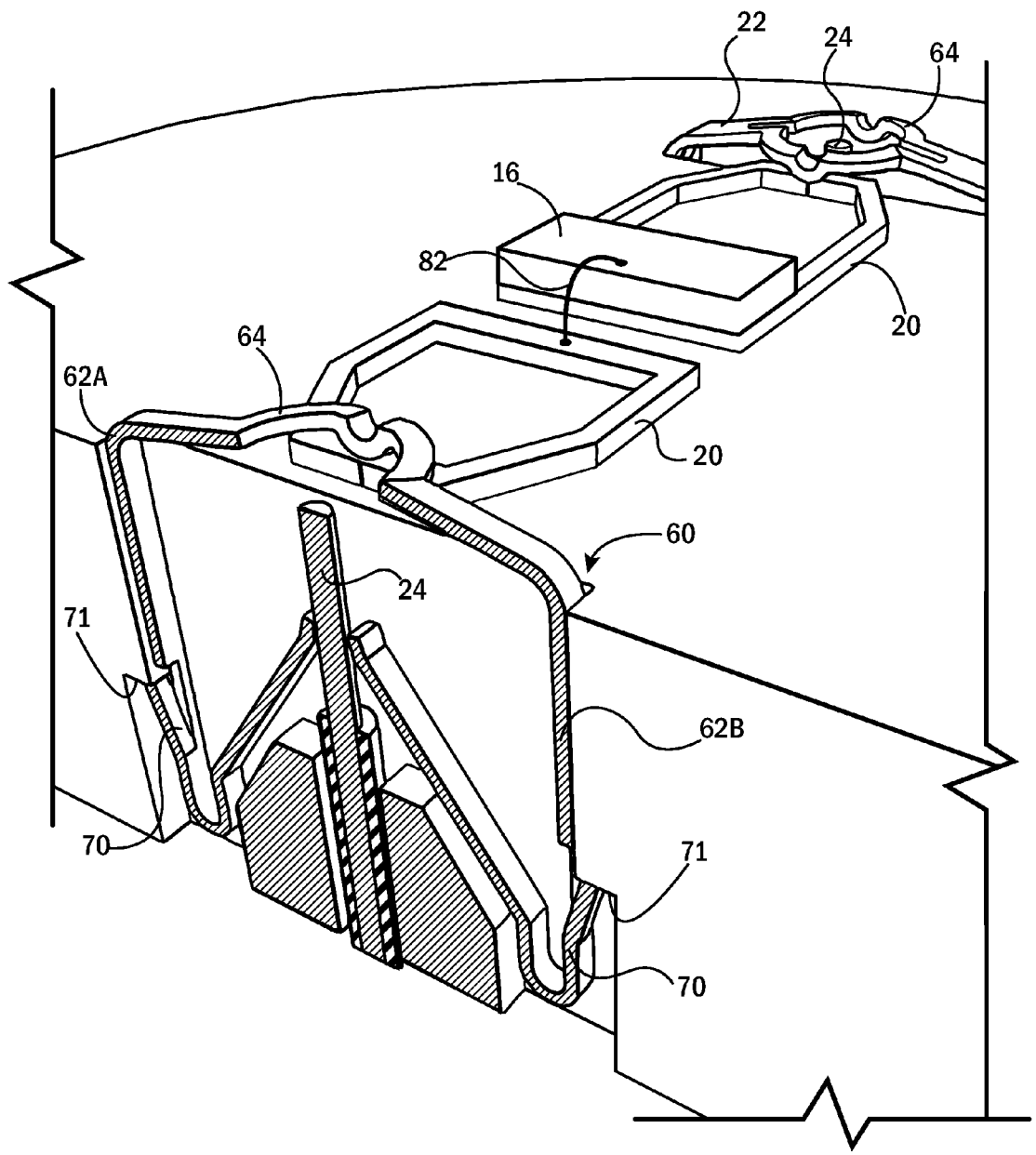
FIG. 6 is a perspective partial cross-section view of an alternative embodiment of the invention employing a chip on board (COB) construction.

Referring now to FIGS. 4 and 6, each of the downwardly extending legs 62 near its lower extent may have an outwardly extending spring biased tooth 70 which in a relaxed state projects beyond the length of the rectangular opening 60 but which may flex inward together with inward flexing of the legs 62 to allow insertion of the spring clamp 22 into the rectangular openings 60. A lower portion of the rectangular opening 60 beneath the surface 14 expands to a greater length providing outwardly extending and downwardly facing ledges 71. When the spring clamp 22 is fully inserted into the rectangular opening 60, the inwardly compressed teeth 70 may relax outward to engage these ledges preventing removal of the spring clamp 22 by upward directed forces.

Figure 5:
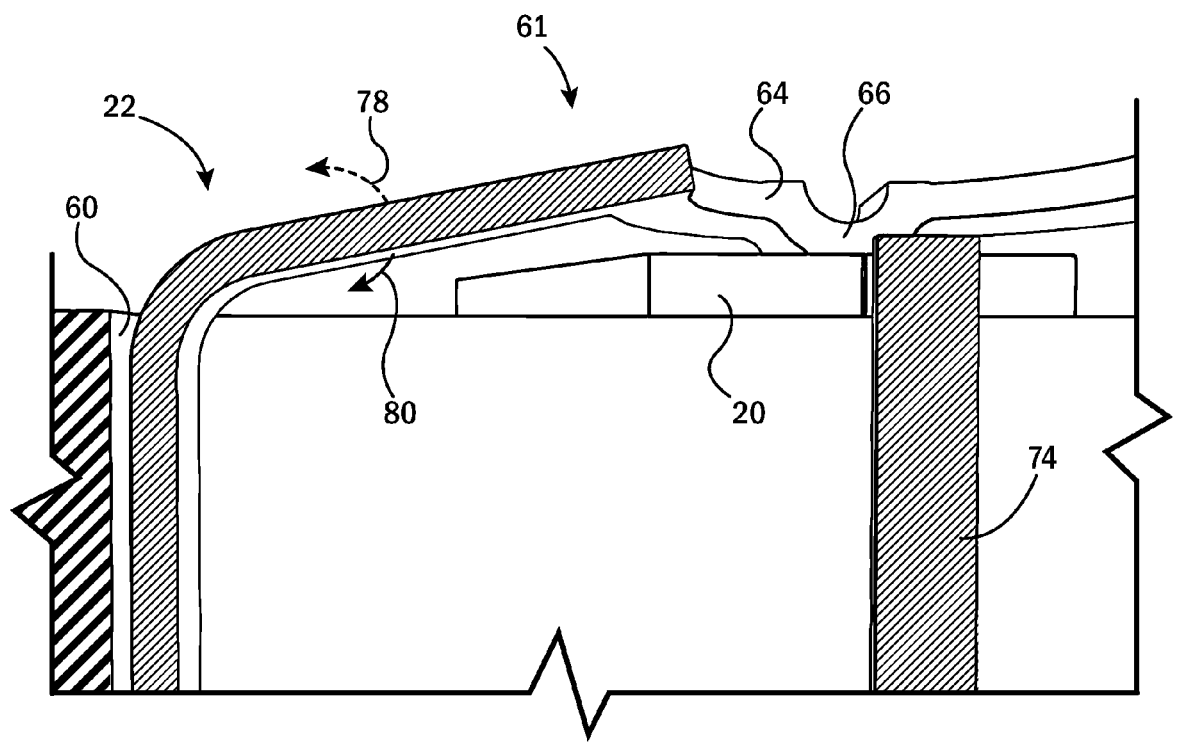
FIG. 5 is a detailed fragmentary view of FIG. 4 in unexploded form showing a spring biasing of the spring clamp to engage a trace on the surface of the heat sink.

Referring momentarily to FIG. 5, when the spring clamp 22 is inserted into the rectangular openings 60 and held downward by engagement of the ledges 71 and teeth 70, the bridge 61 and ring portion 64 are flexed upward indicated by arrows 78 to provide a downward spring force 80 providing a positive engagement between the dimple 66 and the conductive trace 20 that is better resistant to vibration.

Referring again to FIGS. 4 and 6, lower ends of the legs 62 curve upward and toward each other to provide cantilevered conductive fingers 76 that approach each other at an angle and contact along a vertical axis passing through a midpoint of the bridge 61 below the ring portion 64. The cantilevered conductive fingers 76 may thus provide a sliding electrical engagement with the conductor 24 inserted upward through the ceramic substrate/heat sink 12 and between the endpoints of these cantilevered conductive fingers 76. The angled approach of the cantilevered conductive fingers 76 provide for resistance against extraction of the conductor 24 whose frictional engagement with the ends of the cantilevered conductive fingers 76 tends to tighten to tighten their grip on the conductor 24 when it is withdrawn. The same flexure permits some accommodation of thermal expansion that might otherwise unduly increase the tension in the conductor 24.

Referring to FIG. 6, in an alternate embodiment, the LED 16 may be placed on top of one of the traces 20 and a bonding wire 82 attached between the upper surface of the LED 16 and the second trace 20 in a chip on board (COB) configuration.

Figure 8:
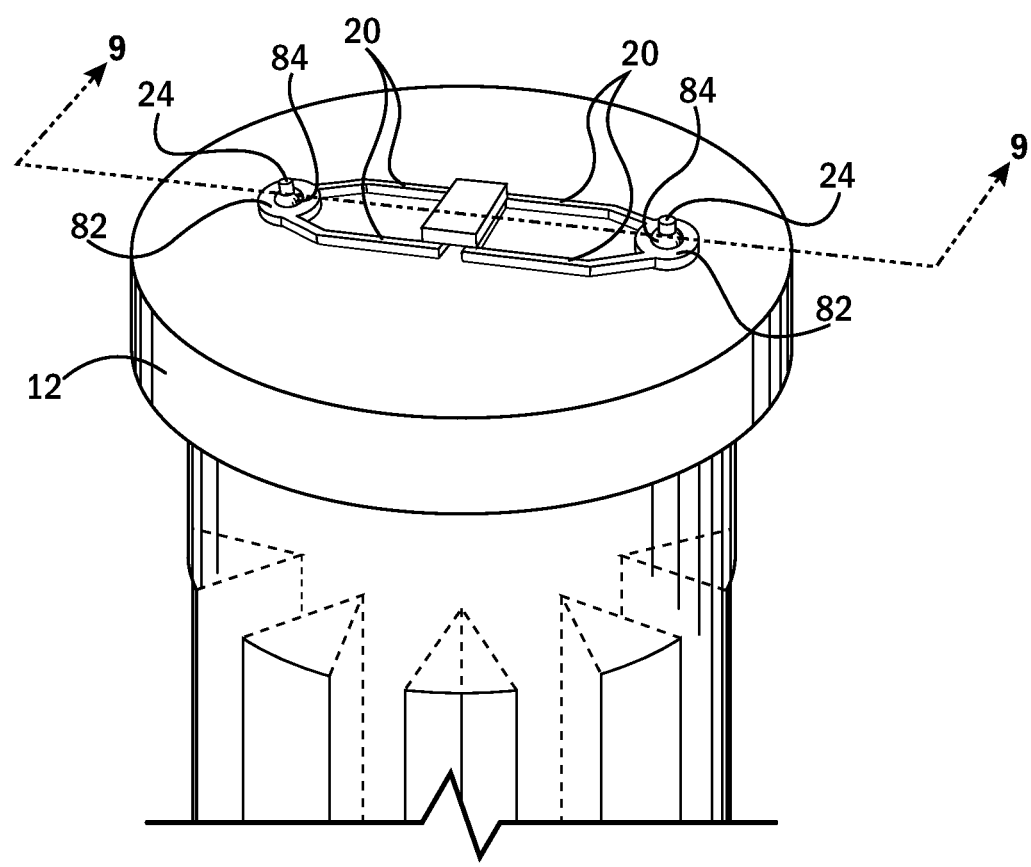
FIG. 8 is a figure similar to that of FIG. 1 showing alternative direct soldering connection of the conductors to traces on the heat sink.
Figure 9:
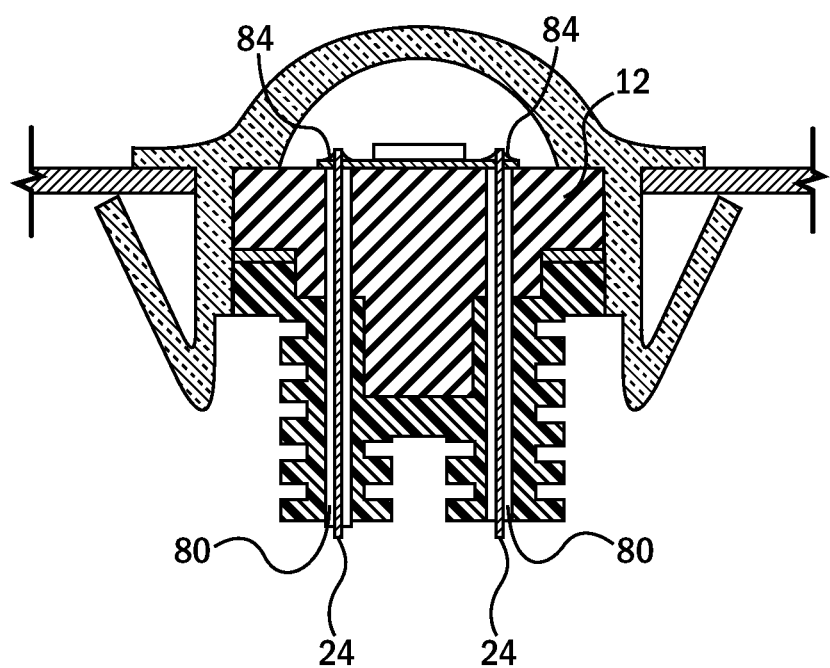
FIG. 9 is a figure similar to that of FIG. 2 showing the direct soldering connection of FIG. 8.

Referring now to FIGS. 8 and 9, in an alternative embodiment the conductor 24 may pass upward through the ceramic substrate/heatsink 12 with the slot 60 of FIG. 3 replaced with a vertical bore 80 sized to receive the conductor 24 and its surrounding insulation. A bared end of the conductor 24 may then pass upward through a conductive doughnut 82 joining with traces 20 to be attached thereto with solder 84 with a simple solder joint.

Various features of the invention are set forth in the following claims. It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. An LED assembly comprising:
an LED dissipating during operation at least 500 mW;
a ceramic heat sink providing a first surface supporting the LED and in thermal communication with the LED;
a first and second conductor in electrical communication with the LED;
a sealed housing receiving the ceramic heat sink and LED therein, the sealed housing having a first portion fitting over the LED to permit the passage of light therethrough and a second portion providing for sealed ingress of the first and second electrical conductors through a housing wall for providing power to the LED; and
a compression element extending between a portion of the housing and ceramic heat sink to provide a predetermined range of biasing force locating the ceramic heat sink against the portion of the housing with dimensional changes in the ceramic heat sink caused by thermal expansion of the ceramic heat sink;
wherein the spring clamp is a flexible metal ring; and
wherein the first portion of the sealed housing provides a ledge abutting a portion of the first surface of the ceramic heat sink and a collar extending around a portion of the ceramic heat sink behind the first surface and wherein the spring clamp includes cantilevered teeth portions providing a wedging engagement with an inner surface of the collar to hold the flexible metal ring in abutment with a second surface of ceramic heat sink behind the first surface.

2. The LED assembly of claim 1 wherein the first portion of the sealed housing is a light transmissive thermoplastic and the second portion of the sealed housing is a thermoplastic fused to the first portion.

3. The LED assembly of claim 2 wherein the electrical conductors provide integral coaxial thermoplastic insulation and where the second portion of the sealed housing is fused to the thermoplastic insulation.

4. The LED assembly of claim 1 wherein the compression element is a flexible metal ring.

5. The LED assembly of claim 1 wherein the metal ring further includes protrusions contacting the second surface and limiting the force applied thereto.

6. The LED assembly of claim 1 wherein the first surface includes metal traces attached directly to the first surface and electrically communicating between the LED and first and second conductors.

7. The LED assembly of claim 6 wherein the metal traces are printed conductive ink.

8. The LED assembly of claim 1 wherein the ceramic is Steatite.

9. The LED assembly of claim 1 wherein the first surface includes conductive traces attached directly to the first surface; and further including:
a first and second spring clamp insertable through apertures in the ceramic heat sink and each having first portions contacting different conductive traces when so inserted and clamping elements receiving and retaining different of the first and second conductors.

10. The LED assembly of claim 9 wherein the first portion is spring biased by the spring clamp against the conductive trace.

11. The LED assembly of claim 9 wherein the metal traces are printed conductive ink.

12. The LED assembly of claim 9 wherein the first and second conductors provide flexible opposed spring elements slidably receiving ends of the conductors in electrical engagement.

13. The LED assembly of claim 9 wherein the ceramic is Steatite.

14. A method of fabricating an LED assembly including:
an LED dissipating during operation at least 500 mW;
a ceramic heat sink providing a first surface supporting the LED in thermal communication with the LED;
a first and second conductor in electrical communication with the LED;
a sealed housing receiving the ceramic heat sink and LED therein, the sealed housing having a first portion fitting over the LED to permit the passage of light therethrough and a second portion providing for sealed ingress of the first and second electrical conductors through a housing wall for providing power to the LED; and
a compression element extending between a portion of the housing and ceramic heat sink to provide a predetermined range of biasing force pressing the ceramic heat sink against the portion of the housing with dimensional changes in the ceramic heat sink caused by thermal expansion of the ceramic heat sink;
the method comprising the steps of:
(a) attaching the LED to the first surface of the ceramic heat sink;
(b) fitting the assembled LED and ceramic heat sink into one the first portion of the housing and retaining the ceramic heat sink in the first portion with the spring clamp;
(c) overmolding the first portion and the conductors with a thermoplastic material providing the second portion of the housing providing a sealed volume holding the ceramic substrate and LED; and
wherein the first portion of the sealed housing provides a ledge abutting a portion of the first surface of the ceramic heat sink and a collar extending around a portion of the ceramic heat sink behind the first surface and including the step of press fitting the spring clamp into engagement with an inner surface of the collar and a second surface of ceramic heat sink behind the first surface.

* * * * *